United States Patent
Aga et al.

(10) Patent No.: US 7,320,929 B2
(45) Date of Patent: Jan. 22, 2008

(54) METHOD OF FABRICATING SOI WAFER

(75) Inventors: Hiroji Aga, Annaka (JP); Kiyoshi Mitani, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 151 days.

(21) Appl. No.: 10/522,413

(22) PCT Filed: Jul. 16, 2003

(86) PCT No.: PCT/JP03/09007

§ 371 (c)(1),
(2), (4) Date: Jan. 26, 2005

(87) PCT Pub. No.: WO2004/012268

PCT Pub. Date: Feb. 5, 2004

(65) Prior Publication Data

US 2006/0040469 A1    Feb. 23, 2006

(30) Foreign Application Priority Data

Jul. 29, 2002  (JP) ............................... 2002-219308

(51) Int. Cl.
*H01L 21/30* (2006.01)
*H01L 21/46* (2006.01)

(52) U.S. Cl. .................... 438/458; 438/459; 438/514; 438/526; 438/530; 257/E21.568; 257/E21.57

(58) Field of Classification Search ............... 438/455, 438/458, FOR. 106, FOR. 104, 456, 459, 438/510, 514, 522, 526, 530, 977; 257/E21.568, 257/E21.569, E21.567, E21.561, 21.568, 257/E21.57

See application file for complete search history.

(56) References Cited

U.S. PATENT DOCUMENTS

| | | | |
|---|---|---|---|
| 5,494,835 A * | 2/1996 | Bruel ......................... | 156/250 |
| 6,191,007 B1 * | 2/2001 | Matsui et al. ............... | 438/459 |
| 6,245,645 B1 * | 6/2001 | Mitani et al. ............... | 438/455 |
| 6,429,104 B1 | 8/2002 | Auberton-Herve | |
| 2001/0046746 A1 * | 11/2001 | Yokokawa et al. ......... | 438/311 |

FOREIGN PATENT DOCUMENTS

GB    2211991 A  *  7/1989
JP    A 11-329996     11/1999

OTHER PUBLICATIONS

Haruhide Fuse et al.; "Kokomade Kita Ion Chunya Gijutsu"; Kogyo Chosakai Publishing Co., Ltd.; Jun. 25, 1991; pp. 34-35.

* cited by examiner

Primary Examiner—Michelle Estrada
Assistant Examiner—Quovaunda Jefferson
(74) Attorney, Agent, or Firm—Oliff & Berridge, PLC (57) ABSTRACT

In order to adjust thickness of a bonded silicon single crystal film 15 depending of thickness of an SOI layer 5 to be obtained, depth of formation d1+tx of a separatory ion implanted layer 4, measured from a first main surface J, in the separatory ion implanted layer formation step is adjusted through energy of the ion implantation. Dose of the ion implantation is set smaller as the depth of formation measured from the first main surface J becomes smaller. A smaller dose results in a smaller surface roughness of the separation surface, and makes it possible to reduce polishing stock removal of the separation surface of the bonded silicon single crystal film in the planarization step. Uniformity in the thickness of the SOI layer can consequently be improved even for the case where a thin SOI layer has to be formed. The present invention is therefore successful in providing a method of fabricating an SOI wafer capable of suppressing variations in the intra-wafer and inter-wafer uniformity of the thickness of the SOI layer to a sufficiently low level, even for the case where a required level of the thickness of the SOI layer is extremely small.

11 Claims, 8 Drawing Sheets

STANDARD DEVIATION $\sigma_2$ OF $t_1$ TO $t_3$

METHOD OF FABRICATING SOI WAFER

FIELD OF THE INVENTION

The present invention relates to a method of fabricating an SOI wafer.

BACKGROUND ART

In the field of mobile communication using mobile phones or the like, it is becoming general to handle high frequency signals of several hundreds of megahertz, and this raises needs for semiconductor devices excellent in high-frequency characteristics. For example, semiconductor devices such as CMOS-IC and high-voltage-resistant-type IC adopt a so-called SOI wafer which is configured by forming a silicon oxide insulating layer (buried oxide film) on a silicon single crystal substrate (also referred to as "base wafer", hereinafter), and by stacking thereon another silicon single crystal layer as an SOI (silicon on insulator) layer. For the case where the SOI wafer is applied to semiconductor devices for high-frequency use, it is necessary to use a silicon single crystal having a large resistivity as the base wafer, in view of suppressing high-frequency loss.

Bonding process is known as a representative method of fabricating the SOI wafer. In the bonding process, a first silicon single crystal substrate as a base wafer and a second silicon single crystal substrate later made into an SOI layer which serves as a device formation area (also referred to as "bond wafer", hereinafter) are bonded while placing a silicon oxide film in between, and the bond wafer is then thinned to a desired thickness to thereby convert the bond wafer into the SOI layer.

Of several methods of thinning the bond wafer, Smart-Cut process (registered trademark) is known as a simple method making it possible to obtain a uniform thickness in a relatively easy manner. The process is characterized in that hydrogen ion is implanted from the bonding surface (referred to as first main surface) of the bond wafer so as to form therein a heavily hydrogen doped layer at a predetermined depth, and after the bonding, the bond wafer is separated at the position of the heavily hydrogen doped layer.

Figure 8A:
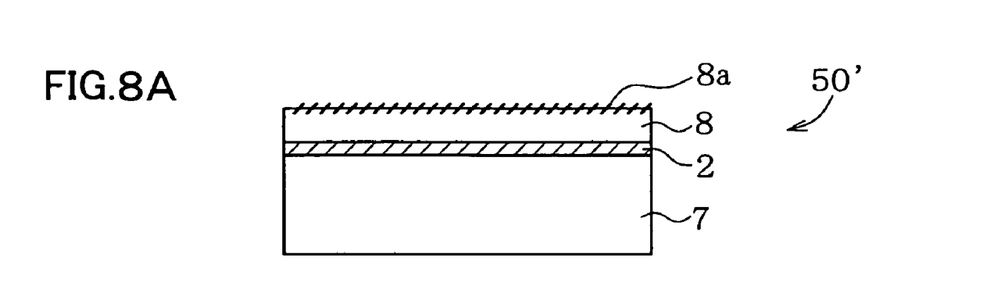
FIG. 8A, FIG. 8B and FIG. 8C are drawings explaining problems in a conventional method of fabricating an SOI wafer.
Figure 8B:
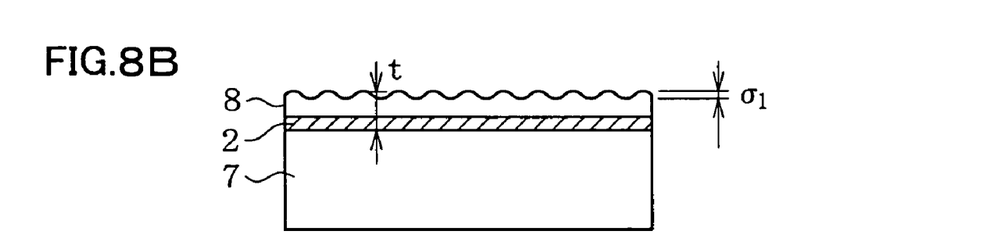
Figure 8C:
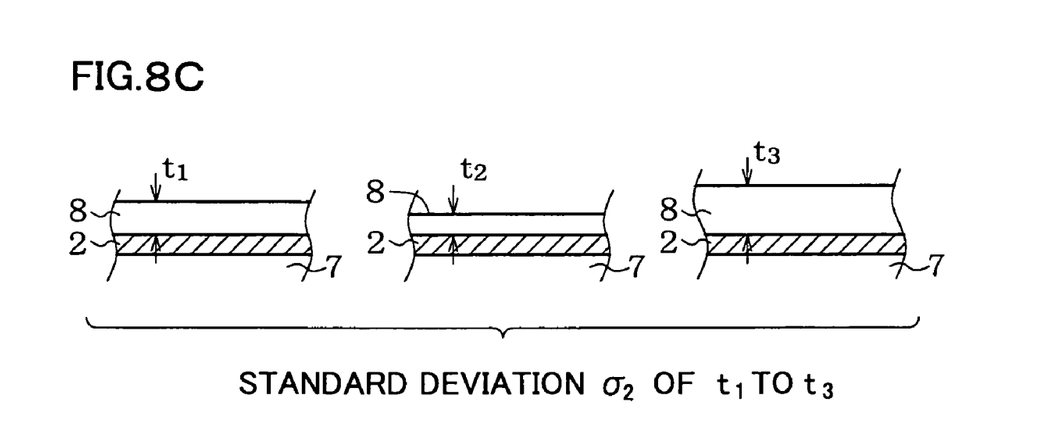

The above-described method, however, suffers from the drawbacks described in the next. That is, as shown in FIG. 8A, in the Smart-Cut process, an SOI wafer 50' (reference numeral 7 denotes a base wafer, and reference numeral 2 denotes a silicon oxide film) obtained after the separation will have, on the surface of the SOI layer 8, a damaged layer 8a caused by the ion implantation, and will have a surface roughness of the separation surface per se considerably larger than that of a mirror surface of a Si wafer of a general product level. In order to remove the damaged layer 8a, the conventional process has adopted mirror polishing (generally referred to as touch polishing, carried out by mechano-chemical polishing) with a small polishing stock removal so as to obtain a mirror surface. This method may be successful in removing roughness component with a short wavelength on the separation surface in a relatively easy manner, but is disadvantageous in that another intra-wafer non-uniformity in the polishing stock removal is newly added. The obtained SOI layer will consequently have distribution of thickness t of 1 to 2 nm as expressed by standard deviation $\sigma_1$ within a single wafer, as shown in FIG. 8B. It is also to be noted that, as shown in FIG. 8C, the distribution amounts approximately 3 nm or more as expressed by standard deviation $\sigma_2$ of the thickness t (t1, t2, t3) among wafers in a wafer lot having the same specification. In particular for the case where the surface roughness of the separation surface is large, the thickness distribution of the polished SOI layer becomes more likely to worsen because the polishing stock removal becomes larger.

In general, the depth of formation of the heavily hydrogen doped layer is increased when a thick SOI layer is required, and the depth of formation of the heavily hydrogen doped layer is reduced when a thin SOI layer is required. On the other hand, it has generally been believed that hydrogen must be implanted to a predetermined critical dose or above irrespective of the depth of formation of the heavily hydrogen doped layer, in order to cause the separation, and therefore even for the case where an extremely thin SOI layer is to be formed, an ion dose level equivalent to that used for formation of a relatively thick SOI layer has been adopted. Roughness of the separation surface will therefore inevitably becomes large, also for formation of a thin SOI layer, to a comparable degree with that for the case where a thick SOI layer is formed, so that influence of intra-wafer non-uniformity in the polishing stock removal will relatively be enlarged as the thickness of the SOI layer decreases.

This sort of non-uniformity in the thickness is inevitable in the light of current technical level of mirror polishing, and may not specifically raise a serious problem so far as the thickness of the SOI layer remains at a level of approximately 100 nm or more. However in recent accelerating trends in further micronization and higher integration of CMOS-LSI, which is a major application field of the SOI wafer, a film of 100 nm thick or around which has been recognized as a ultra-thin film up to several years before is now no more a matter of special surprise. Average thickness required for current ultra-thin SOI layer largely falls below 100 nm, and reaches several tens of nanometer (20 to 50 nm, for example), and in some cases even reaches 10 nm or around. In this case, the above-described level of non-uniformity in the thickness reaches ten to several tens of percent of a target average thickness, so that it is apparent that the non-uniformity directly results in quality variation of the semiconductor devices using the SOI wafer, and in lowered production yield.

It is therefore an object of the present invention to provide a method of fabricating an SOI wafer capable of suppressing both of variations in the intra-wafer and inter-wafer uniformity in the thickness of the SOI layer to a sufficiently low level, even for the case where a required level of the thickness of the SOI layer is extremely small, and of suppressing the quality variation and improving production yield even for the case where the SOI wafer is processed into super-micronized or highly integrated CMOS-LSI and so forth.

SUMMARY OF THE INVENTION

A method of fabricating an SOI wafer of the present invention aimed at solving the above-described subjects comprises:

an insulating film formation step forming an insulating film on a first main surface of at least either one of a first substrate correspond to base wafer, and a second substrate correspond to bond wafer composed of silicon single crystal;

a separatory ion implanted layer formation step forming a separatory ion implanted layer by implanting ions from the ion implantation surface on the first main surface side of the second substrate;

a bonding step bonding the second substrate having the separatory ion implanted layer formed therein and the first substrate while opposing the first main surfaces with each other, placing the insulating film in between;

a separation step succeeding the bonding step, separating a bonded silicon single crystal film, later becoming an SOI layer, from the second substrate at the position of separatory ion implanted layer; and a planarization step planarizing the separation surface side of the bonded silicon single crystal film so as to produce the SOI layer, wherein, in the separatory ion implanted layer formation step, depth of formation of the separatory ion implanted layer measured from the ion implantation surface is adjusted through a magnitude of the ion implantation energy in order to adjust thickness of the bonded silicon single crystal film depending on thickness of the SOI layer to be obtained, and dose of the ion implantation is set smaller as the depth of formation of the separatory ion implanted layer measured from the ion implantation surface becomes smaller. It is to be noted that, in this patent specification, the "ion implantation surface" means the surface of the insulating film for the case where the insulating film is formed on the first main surface of the bond wafer, and means the first main surface (silicon surface) of the bond wafer for the case where the insulating film is not formed.

The present inventors experimentally re-verified ion implantation dose possibly causing the separation of the bond wafer in the Smart-Cut process, and obtained new findings which have never known before. It is necessary to adjust ion implantation energy in order to adjust the depth of formation of the separatory ion implanted layer depending on a desired thickness of the SOI layer. The critical ion dose causative of the separation has conventionally been believed as constant irrespective of ion implantation depth, but it was revealed from the investigations by the present inventors that a smaller ion implantation depth can cause the separation under a lower dose. In other words, the smaller the depth of formation of the separatory ion implanted layer becomes, the smaller the critical dose necessary for the separation becomes. On the other hand, roughness of the separation surface is also related to the ion implantation dose, wherein a smaller dose results in a smaller roughness of the separation surface. The ion implantation dose is therefore set to a small value for the case where the depth of formation of the separatory ion implanted layer measured from the first main surface is small. A small dose can reduce the roughness of the separation surface, and can improve uniformity in the thickness of the SOI layer even when it is formed to a small thickness.

The planarization step can further improve uniformity in the thickness of the SOI layer if the step further comprises a step of polishing the separation surface side of the bonded silicon single crystal film. More specifically, a smaller roughness of the separation surface of the bonded silicon single crystal film obtained by the separation makes it possible to set a smaller value for the polishing stock removal of the separation surface of the bonded silicon single crystal film in the polishing step. In other words, reduction in the roughness of the separation surface can reduce the polishing stock removal of the separation surface of the bonded silicon single crystal film in the polishing step, and can effectively reduce influences of the intra-wafer non-uniformity of the polishing stock removal.

In an exemplary case where the thickness of the SOI layer to be obtained is small while assuming the thickness of the insulating film formed on the bond wafer as constant, the ion implantation dose is set small corresponding to the small thickness, and also the polishing stock removal of the separation surface of the bonded silicon single crystal film in the polishing step is set small. In other words, a smaller thickness of the bonded silicon single crystal film, and consequently of the final SOI layer, results in a shallower position of formation of the separatory ion implanted layer, reduces the ion implantation dose, reduces the polishing stock removal in the planarization of the separation surface, and reduces influences of the non-uniformity in the polishing stock removal to a considerable degree. This makes it possible to suppress variations in the intra-wafer and inter-wafer uniformity of the thickness of the SOI layer to a sufficiently low level, despite the thickness of the SOI layer is extremely small.

BEST MODES FOR CARRYING OUT THE INVENTION

The following paragraphs will describe best modes for carrying out the invention.

Figure 1:
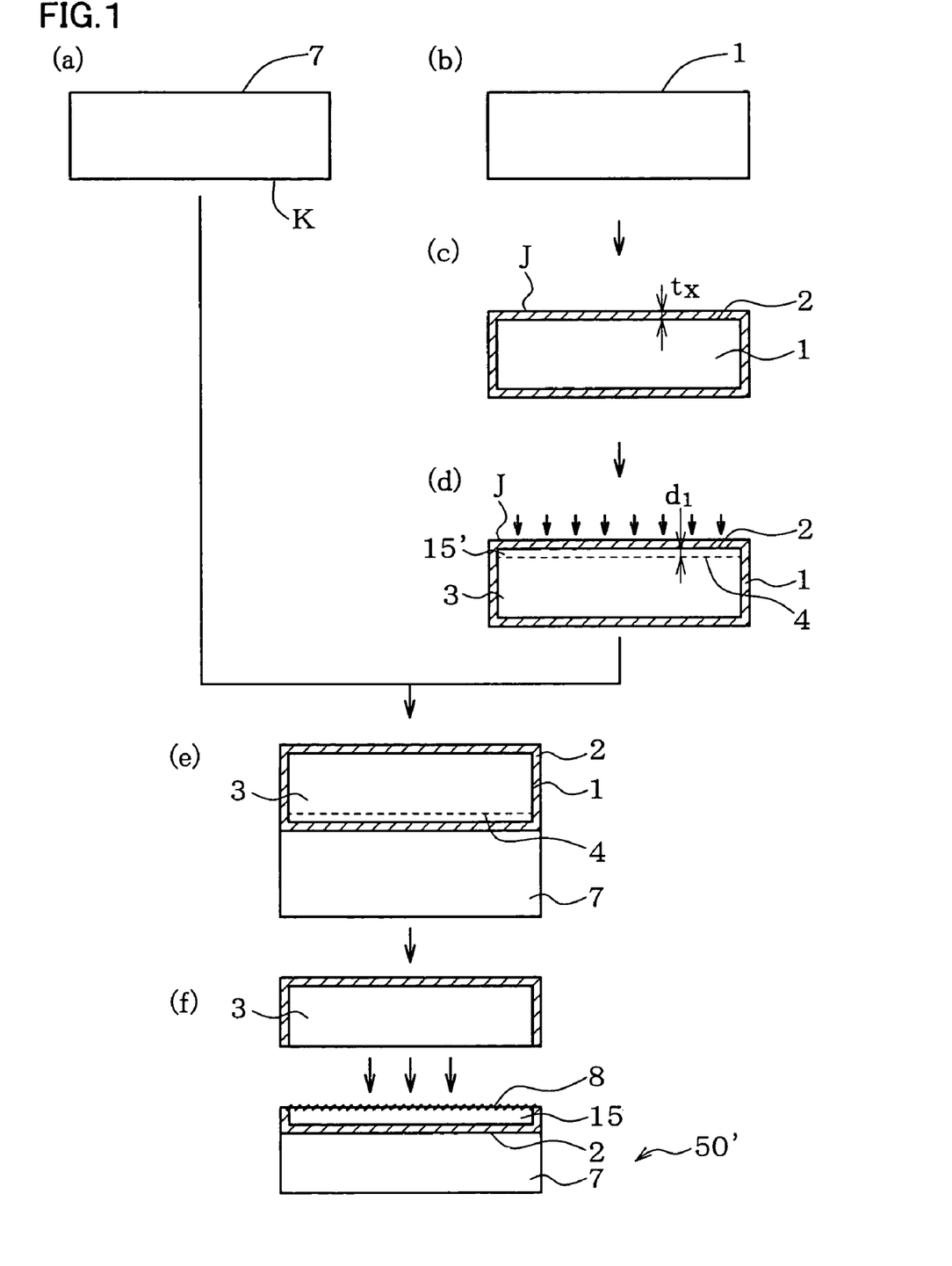
FIG. 1 is a drawing explaining process steps of the method of fabricating an SOI wafer according to a first embodiment of the present invention.

FIG. 1 is a drawing explaining a basic embodiment of the method of fabricating an SOI wafer according to the present invention. First, a base wafer 7 shown in step (a) as a first substrate typically composed of silicon single crystal, and a bond wafer 1 shown in step (b) as a second silicon single crystal substrate are obtained. The bond wafer 1 has, as shown in step (c), a silicon oxide film 2 as an insulating film formed at least on a first main surface J side thereof. The silicon oxide film 2 can be formed by thermal oxidation such as wet oxidation or dry oxidation, and it is also allowable to adopt a method such as CVD (chemical vapor deposition). Thickness of the silicon oxide film tx is adjusted to approximately 50 nm to 2 μm, both ends inclusive, considering that it is used as an insulating layer typically for MOS-FET. The base wafer 7 may be an insulating substrate such as quartz substrate or sapphire substrate, or may be a compound semiconductor substrate composed of GaAs, InP or SiC, wherein use of a silicon single crystal substrate as in the present invention is preferable, taking size expansion and cost into consideration. It is also allowable to form a silicon nitride film or silicon oxinitride film as the insulating film, in place of the silicon oxide film 2.

Next, as shown in step (d), assuming now the first main surface J side of the bond wafer 1, which is the surface of the silicon oxide film 2 in this embodiment, as the ion implantation surface, an ion is implanted typically by irradiating a hydrogen ion beam, to thereby form a separatory ion implanted layer 4. The ion for forming the separatory ion implanted layer 4 can be at least any one ion selected from the ion group comprising hydrogen ion and rare gas (He, Ne, Ar, Kr, Xe) ions. Hydrogen ion is used in this embodiment, but it is also allowable to form the separatory ion implanted layer 4 by implanting a rare gas ion such as helium ion, neon ion or argon ion, in place of hydrogen ion.

The bond wafer 1 having the separatory ion implanted layer 4 formed therein and the base wafer 7 are cleaned with a cleaning solution, and both wafers 1, 7 are then bonded, as shown in step (e), on the side having the silicon oxide film 2 formed thereon (that is, first main surfaces J, K side). Next, as shown in step (f), the obtained stack is annealed at a low temperature of 400 to 600° C., to thereby allow the bond wafer 1 to separate at around the peak concentration position of the separatory ion implanted layer 4, and a portion remained on the base wafer 7 side serves as a bonded silicon single crystal film (separation step). In some cases, the annealing for separation can be omitted by raising the ion implantation dose in the formation of the separatory ion implanted layer 4, or by preliminarily subjecting the surface to be stacked to plasma treatment to thereby activate the surface. The residual bond wafer portion 3 remained after the separation can be recycled as the bond wafer or base wafer, after being re-polished on the separation surface.

In order to obtain a final SOI wafer, it is necessary, after the separation, to carry out bond annealing for tightly bonding the base wafer 7 and SOI layer (bonded silicon single crystal film 15) while placing the silicon oxide film 2 in between. The bond annealing is carried out in an inert gas such as argon gas, in hydrogen gas, or in a mixed gas of these, generally at a high temperature of 1,000 to 1,250° C., both ends inclusive. It is also allowable, in advance of the bond annealing, to carry out oxidation annealing for protecting the surface of the SOI layer at lower temperatures (700 to 1,000° C., both ends inclusive).

It is also allowable to carry out planarization annealing for further planarizing the separation surface of the bonded silicon single crystal film 15 after the separation, or the polished surface obtained by planarizing the separation surface by polishing. The planarization annealing is carried out in an inert gas such as argon gas, in hydrogen gas, or in a mixed gas of these, generally at 1,100 to 1,380° C. More specifically, it can be carried out using a general heater-powered annealing furnace such as batch-type vertical furnace or horizontal furnace, or also using a single-wafer RTA apparatus capable of completing the annealing within several seconds to several minutes typically with the aid of lamp heating. The planarization annealing can also be carried out commonly with the above-described bond annealing.

In step (d) in FIG. 1, the separatory ion implanted layer 4 is formed so as to produce a peak position of hydrogen concentration, observed in a hydrogen concentration profile along the depth-wise direction of the wafer, typically at a depth ($d_1$: expressed by a depth excluding the silicon oxide film 2, for the case where the silicon oxide film 2 is formed on the surface) of 50 nm to 300 nm. The depth $d_1$ corresponds to the thickness of the bonded silicon single crystal film 15. The first depth $d_1$ of less than 50 nm may fail in obtaining the bonded silicon single crystal film 15 with a sufficient thickness, and that of exceeding 300 nm may result in too large polishing stock removal, described later, for the case where the SOI layer of as thin as 50 nm is desired, and may fail in ensuring a desirable thickness distribution.

In the process of forming the separatory ion implanted layer 4, the depth of formation $d_1+t_x$ of the separatory ion implanted layer 4 measured from the ion implantation surface is adjusted by ion implantation energy (acceleration voltage). More specifically, the larger the depth of formation ($d_1+t_x$) of the separatory ion implanted layer 4 is, the larger the ion implantation energy is set. For the case where the thickness of the silicon oxide film $t_x$ is adjusted to for example approximately 20 nm to 200 nm and the depth of formation $d_1$ of the separatory ion implanted layer 4, corresponded to the thickness of the bonded silicon single crystal film 15, is set within the above-described range of 50 nm to 300 nm, $d_1+t_x$ falls in a range from 70 nm to 500 nm. For the purpose of forming the separatory ion implanted layer 4 with this range of depth, it is preferable to adjust the ion implantation energy to 3 keV to 50 keV or around.

The smaller the depth of formation $d_1+t_x$ of the separatory ion implanted layer 4 measured from the ion implantation surface becomes, the smaller the critical dose of the ion implantation causative of the separation at the separatory ion implanted layer becomes. A smaller depth of formation $d_1+t_x$ of the separatory ion implanted layer 4 can therefore allow the ion dose to be set to a smaller value. For the case where the depth $d_1+t_x$ falls within a range from 70 nm to 500 nm, the ion dose for forming the separatory ion implanted layer 4 is preferably set within a range from $3\times10^{16}/cm^2$ to $5\times10^{16}/cm^2$.

Figure 2A:
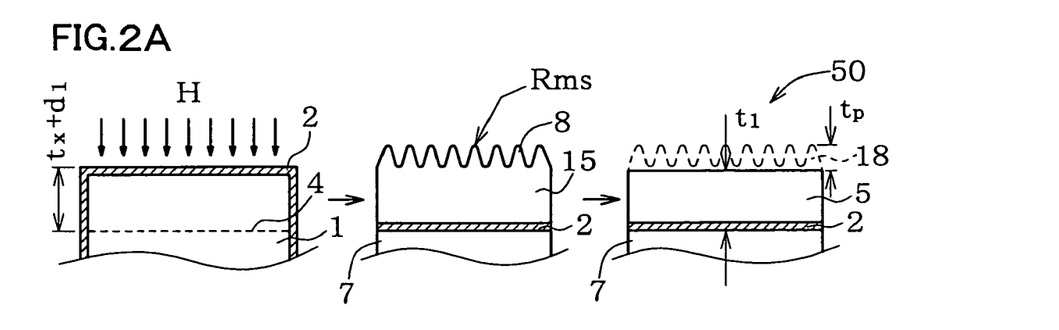
FIG. 2A, FIG. 2B and FIG. 2C are drawings explaining a first effect of the present invention.
Figure 2B:
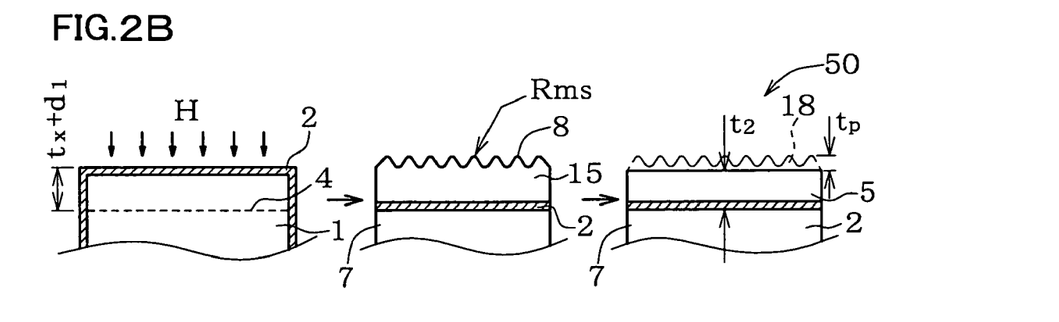
Figure 2C:
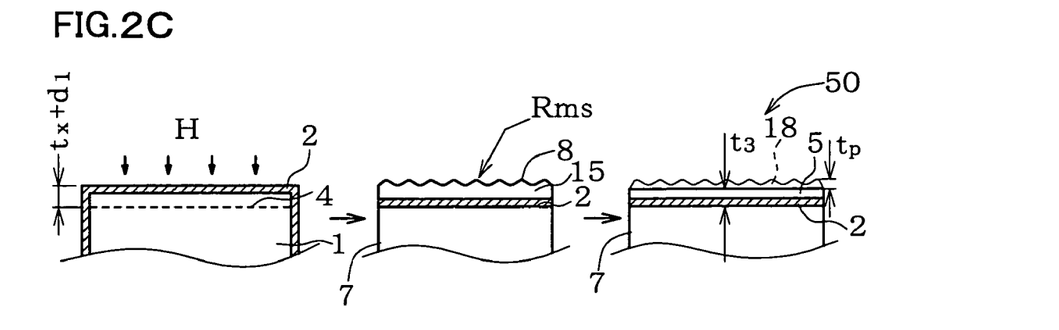

The surface (separation surface) of the bonded silicon single crystal film 15 after the separation is coarsened due to formation of a damaged layer 8 in association with the ion implantation, as shown in FIG. 2A to FIG. 2C. The damaged layer 8 is then removed by polishing (touch polishing) so as to planarize the surface of the bonded silicon single crystal film 15, to thereby obtain a final SOI layer 5. An SOI wafer 50 is thus obtained. The polishing stock removal is necessarily set larger as the surface roughness due to the damaged layer 8 grows larger. A larger polishing stock removal, however, exerts a larger influence of the intra-wafer variation thereof on the thickness distribution of the final SOI layer 5, and makes it difficult to obtain the SOI layer 5 having a desired thickness distribution. It is therefore preferable to reduce the polishing stock removal in the planarization process to as small as possible, and for this purpose, reduction in the roughness of the separation surface is effective. Absolutely the same will apply not only to the case where the planarization process is effected by polishing, but also to the case where the planarization by annealing is followed by polishing, or to the case where the planarization by polishing is followed by annealing.

Figure 5:
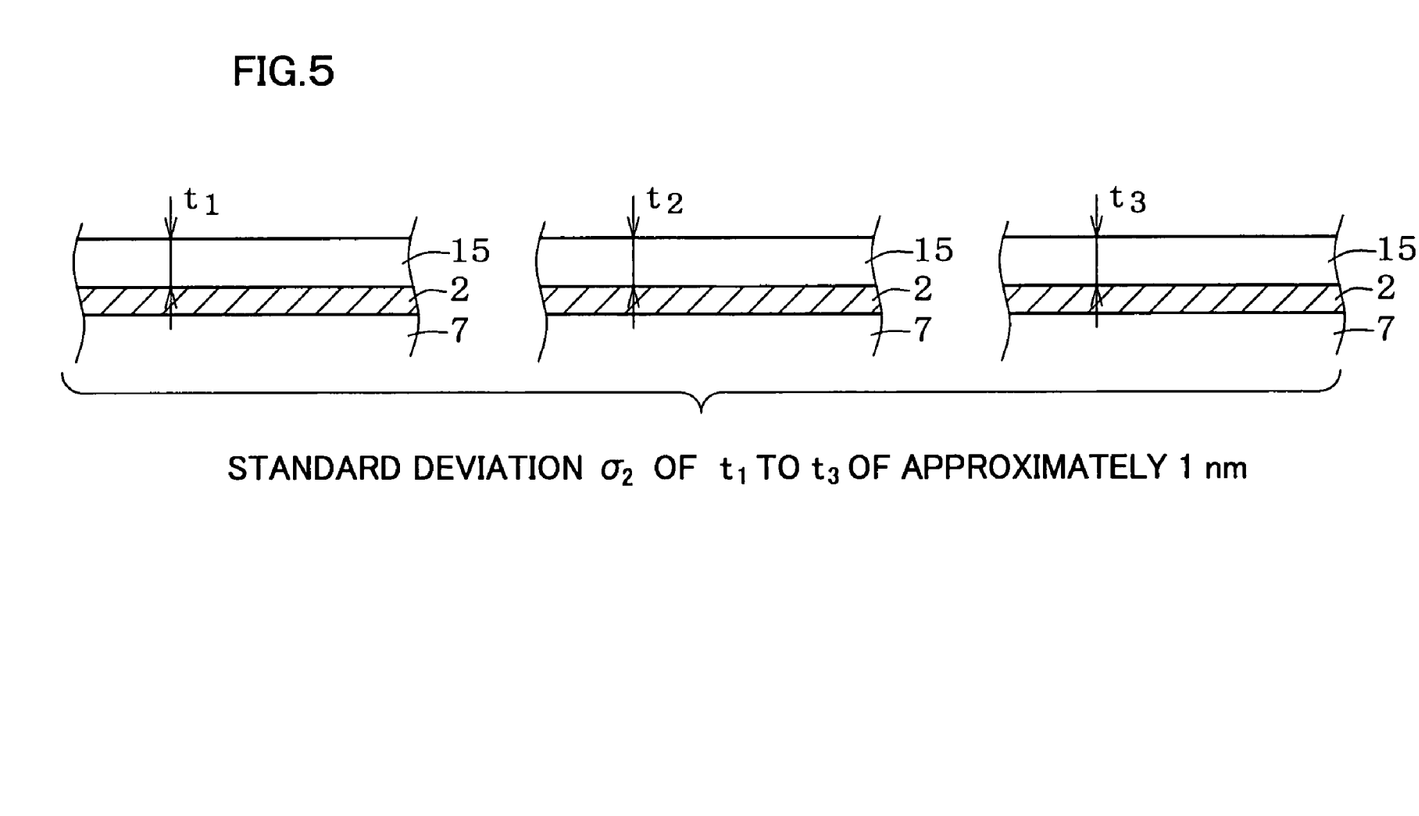
FIG. 5 is a drawing explaining a second effect of the present invention.

As has been described in the above, a smaller depth of formation of the separatory ion implanted layer 4 results in a smaller critical dose necessary for the separation. A smaller depth of formation of the separatory ion implanted layer 4 ($d_1+t_x$ in FIG. 2A, FIG. 2B and FIG. 2C) results in a smaller setting of the ion implantation dose. Assuming now that the thickness $t_x$ of the silicon oxide film 2 is kept constant, the depth of formation $d_1+t_x$ of the separatory ion implanted layer 4 becomes shallower as the thickness of the SOI layer to be obtained becomes smaller, and the ion implantation dose is also set small corresponding to the thickness ($t_1$, $t_2$, $t_3$ or depth $d_1+t_x$ in FIG. 2A, FIG. 2B and FIG. 2C). The separation surface of a thin bonded silicon single crystal film 15 obtained under a reduced dose has a small roughness Rms, and the polishing stock removal $t_p$ in the planarization step can be set small. Consequently, a thinner SOI layer 5 requires only a smaller polishing stock removal tp, and this makes influences of non-uniformity in the polishing stock removal less likely to exert, and makes it possible to suppress both of variations in the intra-wafer and inter-wafer thickness uniformity of the SOI layer to a sufficiently small level. For an exemplary case where an average thickness of the SOI layer 5 is set to 10 to 50 nm or around, the uniformity in the thickness of the SOI layer 5 can be ensured as small as 1.5 nm for example, as expressed by standard deviation of the thickness within a single wafer. It is also made possible, as shown in FIG. 5, to ensure the thickness t (=t1, t2, t3) among wafers based on the same specification to as small as 3 nm or less, as expressed by standard deviation σ2. In particular even for the case where the SOI layer 5 is extremely thinned down to approximately 20 nm or less, it is made possible to reduce intra-wafer and inter-wafer variations in the thickness to a range fully allowable for the practical use. According to the final thickness, it is even made possible to omit the polishing, and to obtain a surface state markedly improved from the conventional state only by the planarization by annealing, so that variation in the thickness can further be reduced.

Figure 6:
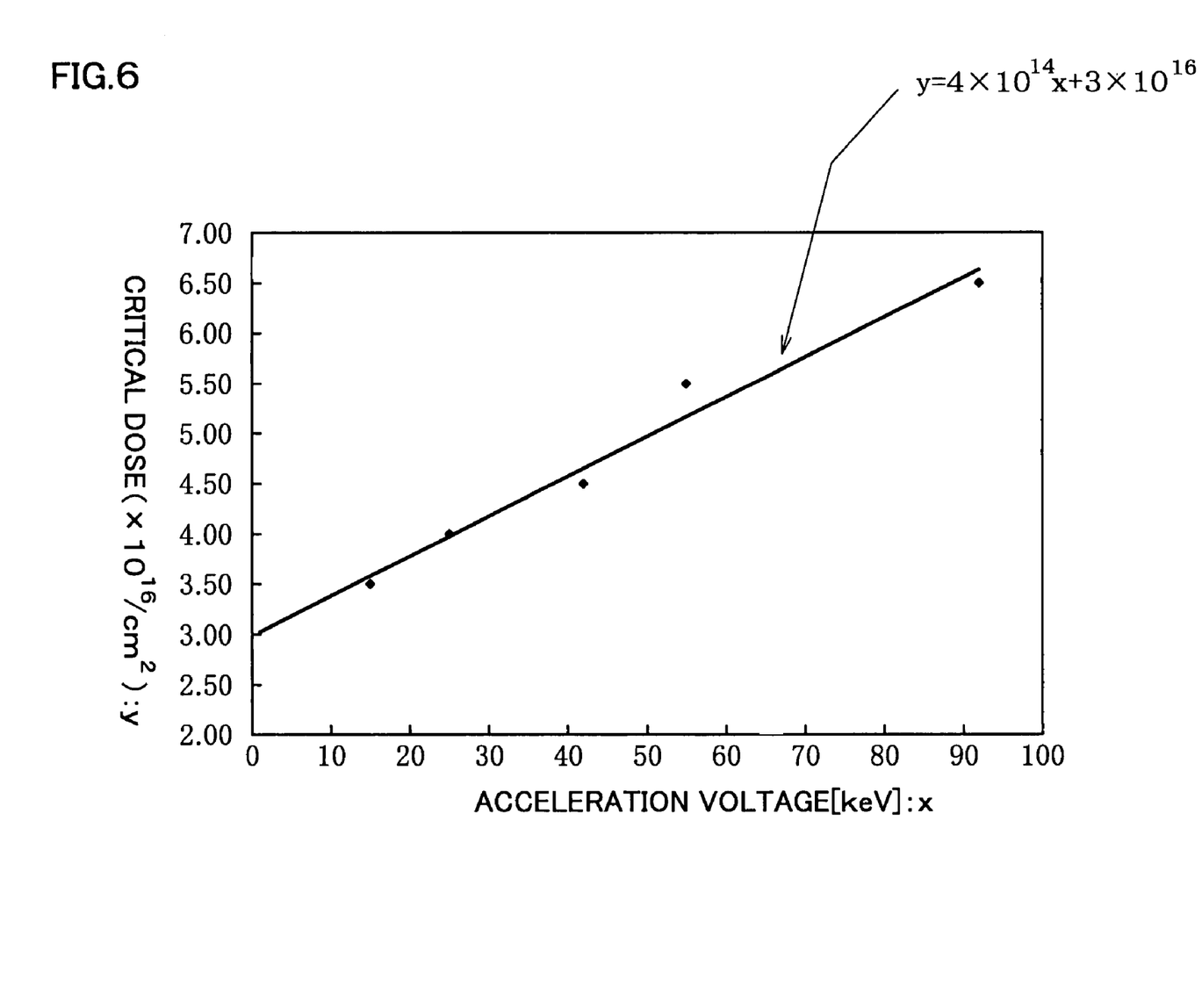
FIG. 6 is a graph expressing a relation between ion implantation energy (acceleration voltage) and critical dose causative of the separation.
Figure 7:
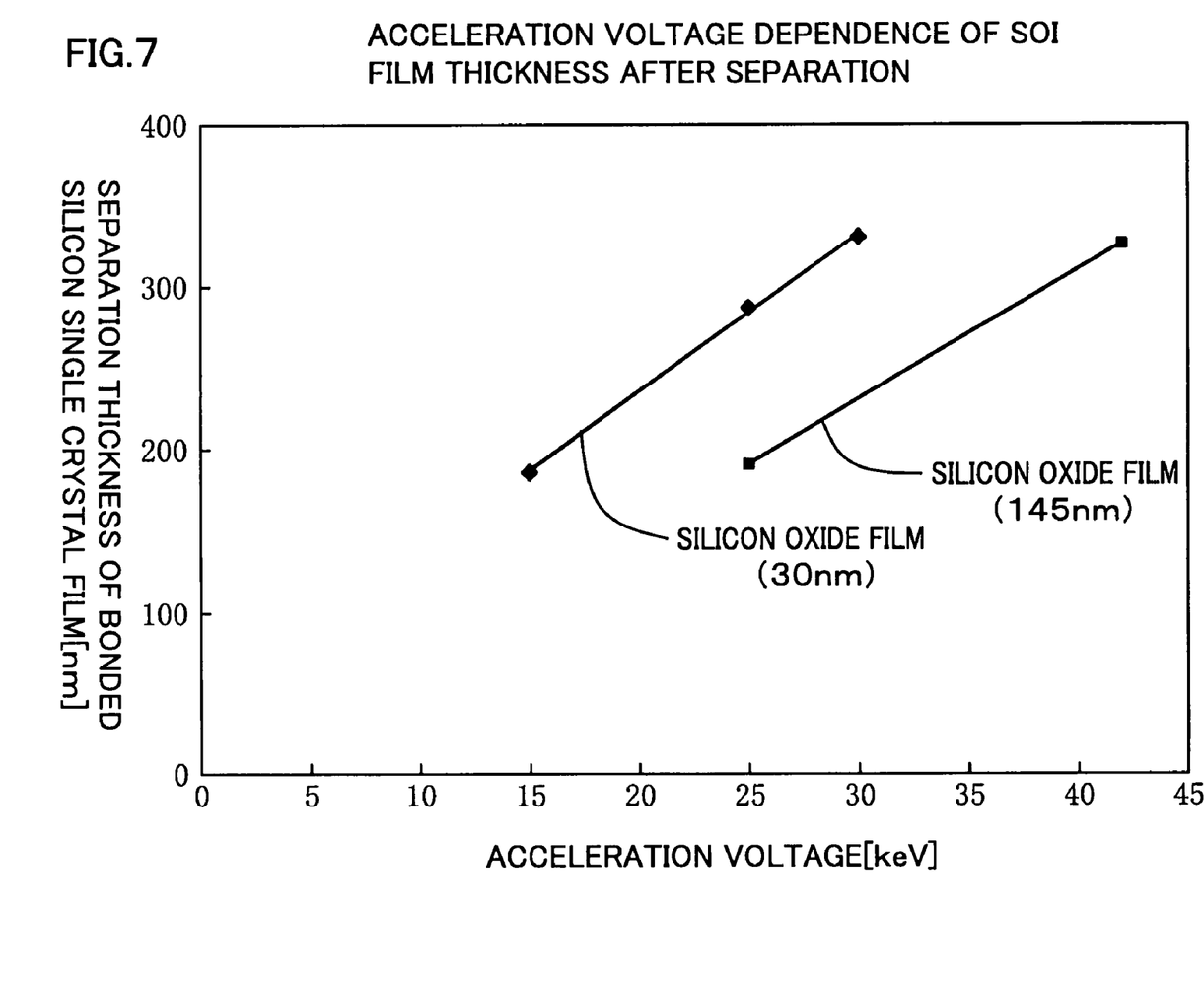
FIG. 7 is a graph expressing relations between ion implantation energy (acceleration voltage) and separation thickness of the bonded silicon single crystal film.

FIG. 6 shows results of measurement of critical dose necessary for the separation when the separatory ion implanted layer is formed by hydrogen ion implantation, measured under varied hydrogen ion implantation energy (acceleration voltage). It is apparent that the critical dose decreases with decrease in the energy. More specifically, the critical dose decreases substantially linearly with decrease in the energy (an experimental formula expressing relation between the critical dose and energy obtained by linear regression also given in the drawing). FIG. 7 shows relations between hydrogen ion implantation energy (acceleration voltage) and separation thickness of the bonded silicon single crystal film 15 (or, depth of formation d1 of the seperatory ion implanted layer 4) for the cases where the silicon oxide film 2 is formed on the bond wafer 1 side to a thickness of 30 nm and 145 nm, respectively. It is found for both cases that a higher energy results in a larger thickness of the bonded silicon single crystal film 15. It is also found that the same separation thickness can be obtained at a lower energy by reducing the thickness of the silicon oxide film 2.

The experiments below were conducted according to the steps shown in FIG. 1. That is, by forming the separatory ion implanted layer 4 under various settings of ion implantation energy and dose, the thickness of the silicon single crystal after the separation (d1 in FIG. 1) was varied depending on target values of the thickness of the SOI layer 5. The separation surface was then planarized by mechano-chemical polishing while adjusting the polishing stock removal according to the roughness Rms thereof, to thereby fabricate the SOI wafer. Ion implantation dose was determined based on the experimental formula ($y=4\times10^{14}x+3\times10^{16}$) shown in FIG. 6, depending on a set value of ion implantation energy. Roughness of the separation surface Rms is a root mean square roughness calculated by the procedure below. A three-dimensional geometric profile of the main surface of the SOI layer is measured using an atomic force microscope while setting a measurement area as 10 μm×10 μm (expressed by a projected area onto the x-y plane, under setting of x-y-z orthogonal coordinate system having height in z direction). Assuming now that each of measured coordinate values in the height-wise direction for the individual measurement point is given by Z, an average value thereof by Zm, and summation of $(Z-Zm)^2$ for all measurement points by $\Sigma(Z-Zm)^2$, Rms is given by a square root of a value obtained by dividing the summation by the number of measurement points N, as expressed below:

$$Rms=\{(1/N)\times\Sigma(Z-Zm)^2\}^{1/2}$$

Average thickness and uniformity index (a value of 3σ, assuming the standard deviation as σ) were also determined by a measurement of intra-wafer thickness distribution of the SOI layer 5 by reflection spectroscopy. Results are shown in Table 1.

TABLE 1

|  | Comparative example 1 | Example 1 | Example 2 | Example 3 |
|---|---|---|---|---|
| Thickness of target | 300 nm | 50 nm | 20 nm | 20 nm |
| Thickness of silicon oxide film | 150 nm | 150 nm | 150 nm | 30 nm |
| Implantation energy | 50 keV | 15 keV | 11 keV | 3.6 keV |
| Dose | 5.0E16 | 3.6E16 | 3.5E16 | 3.2E16 |
| Thickness of bonded silicon single crystal | 390 nm | 112 nm | 80 nm | 76 nm |
| Rms (10 μm square) | 6.7 nm | 4.1 nm | 3.7 nm | 3.3 nm |
| Polishing stock removal | 100 nm | 63 nm | 60 nm | 55 nm |
| Final thickness of SOI layer | 290 nm | 49 nm | 20 nm | 21 nm |
| Uniformity in thickness | 2.0 nm | 1.2 nm | 1.0 nm | 0.7 nm |

It is found that reduction in the ion implantation energy aimed at thinning the SOI layer 5 results in decrease in necessary dose. The roughness Rms of the separation surface is therefore found to be reduced, and the polishing stock removal in the planarization polishing can be set small. The SOI layer obtained under a small set value of the polishing stock removal gives a desirable uniformity in the thickness. If a level of uniformity in the thickness is desired to be suppressed in particular to as small as 1.5 nm or less, the roughness Rms of the separation surface is preferably controlled to as small as 4.5 nm or below.

The embodiments of the present invention have been described in the above. It is to be noted that the present invention is by no means limited to these embodiments, and allows various alterations and modifications added thereto, without departing from the technical scope understood from the claims. For example, it is also allowable, as shown in steps (a) and (b) in FIG. 3, to form the silicon oxide layer 2 only on the base wafer 7. This configuration has no silicon oxide film 2 formed on the side of the bond wafer 1 in which the separatory ion implanted layer is formed, and is successful in reducing the depth of formation of the separatory ion implanted layer 4 by the thickness tx of the silicon oxide film 2 as compared with the steps shown in FIG. 1, and is therefore successful in reducing the ion implantation energy. This consequently makes it possible to reduce the dose necessary for obtaining the bonded silicon single crystal film 15, and also the SOI layer 5, of the same thickness, and to further improve the uniformity level of the thickness of the resultant SOI layer 5 by virtue of reduced roughness of the separation surface, and of reduced polishing stock removal for the planarization.

Figure 3:
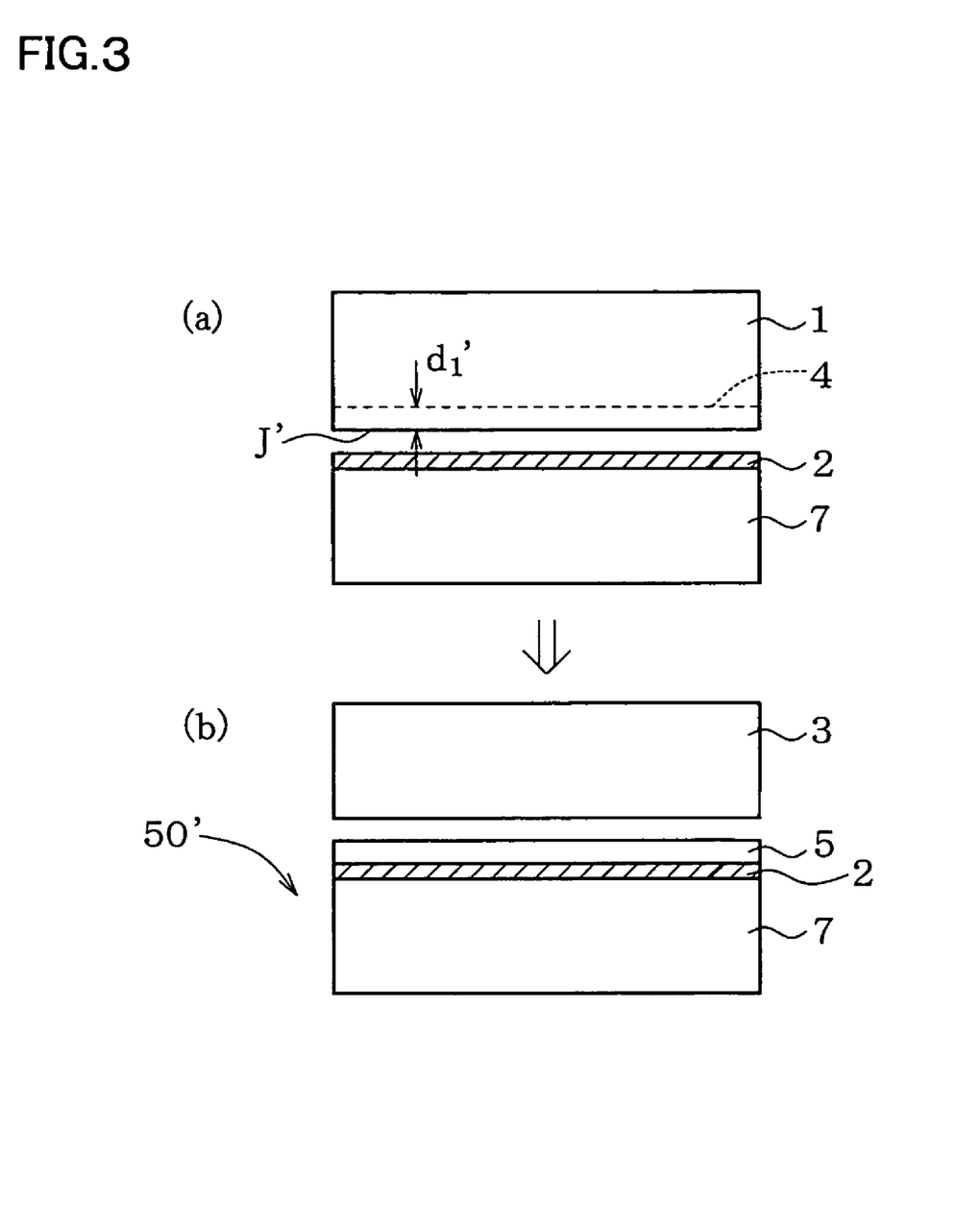
FIG. 3 is a drawing explaining process steps of a method of fabricating an SOI wafer according to a second embodiment of the present invention.

Because the silicon oxide film 2 is omitted herein in the formation of the separatory ion implanted layer 4, it is all enough to set the depth of ion implantation equivalent to the depth of formation d1' measured from the first main surface J'. For the case where d1' is set within the above-described range from 50 nm to 300 nm, the separatory ion implanted layer 4 can be formed at the depth by the ion implantation using hydrogen ion, preferably by adjusting the ion implantation energy to 1 keV to 25 keV or around. Dose of ion for forming the separatory ion implanted layer 4 is preferably set to $3\times10^{16}/cm^2$ to $4\times10^{16}/cm^2$.

Figure 4:
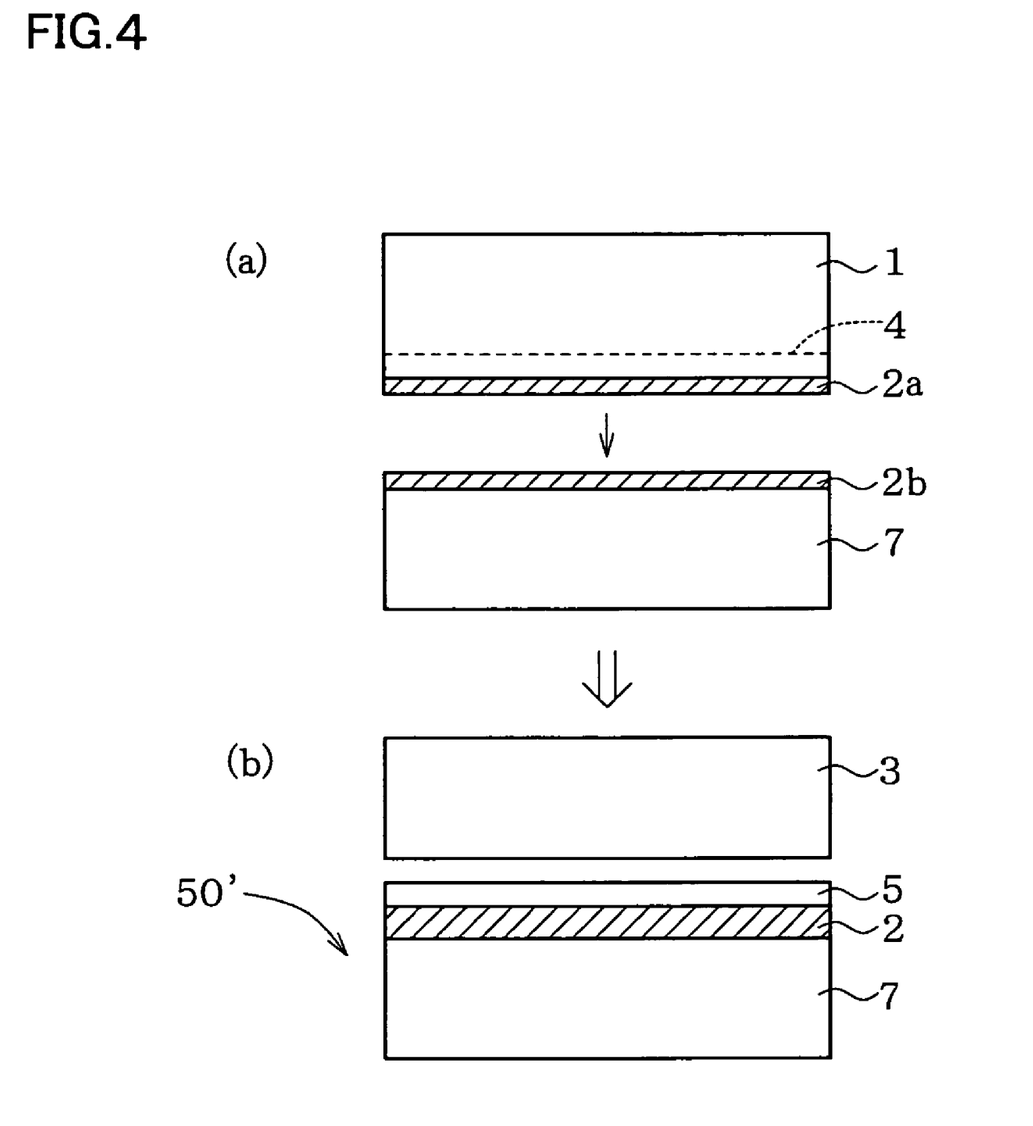
FIG. 4 is a drawing explaining process steps of a method of fabricating an SOI wafer according to a third embodiment of the present invention.

It is also allowable, as shown in steps (a) and (b) in FIG. 4, to form silicon oxide films 2a, 2b on both bonding surfaces of the base wafer 7 and bond wafer 1, respectively. Also this case is successful in reducing the thickness of the silicon oxide film 2a on the bond wafer 1 side, because a part of the thickness of the silicon oxide film is shared by the base wafer 7 side. Although only to a lesser degree as compared with the case shown in FIG. 3, also this case makes it possible to set the ion implantation dose to a lower level, and to further improve the level of uniformity in the thickness of the resultant SOI layer 5.

In the practical fabrication process of the SOI wafer (mass production process), the present invention is preferably applicable to ion implantation with different depths of implantation, depending on specifications of the thickness of the SOI layer or of buried oxide film of the SOI wafer to be fabricated. For an exemplary case where there is a need of fabricating a plurality of types of the SOI wafers differed in the thickness specification of the SOI layer with a constant thickness of the buried oxide film, a smaller thickness specification needs a smaller ion implantation depth, so that the SOI wafers are fabricated under a condition in which the ion implantation energy and dose are set small. This makes it possible, even for on-specification products having a small thickness of the SOI layer, to fabricate the SOI wafers excellent in uniformity in the thickness, without degrading relative uniformity in the thickness as compared with that of on-specification products having a larger thickness of the SOI layer.

The invention claimed is:

1. A method of fabricating an SOI wafer comprising:
   an insulating film formation step of forming an insulating film on a first main surface of at least one of a first substrate, and a second substrate composed of silicon single crystal;
   a separatory ion implanted layer formation step of forming a separatory ion implanted layer by implanting ions from an ion implantation surface on the first main surface side of the second substrate;
   a bonding step of bonding the second substrate having the separatory ion implanted layer formed therein and the first substrate while opposing the first main surfaces with each other, and placing the insulating film in between;
   a separation step of separating a bonded silicon single crystal film, later becoming an SOI layer, from the second substrate at a position of the separatory ion implanted layer, the separation step forming a separation surface of the bonded silicon single crystal film with a roughness (Rms) of 4.5 nm or less; and
   a planarization step of planarizing having the separation surface side of the bonded silicon single crystal film so as to produce the SOI layer,
   wherein the separatory ion implanted layer formation step further includes, based on a desired thickness of the SOI layer, adjusting a depth of formation of the separatory ion implanted layer measured from the ion implantation surface through control of a magnitude of an ion implantation energy, and
   wherein a dose of the ion implantation is lowered as the depth of formation of the separatory ion implanted layer measured from the ion implantation surface becomes less, the dose of the ion implantation being such that the separation surface of the bonded silicon single crystal film formed in the separation step has the roughness (Rms) of 4.5 nm or less.

2. The method of fabricating an SOI wafer as claimed in claim 1, wherein the planarization step further comprises a polishing step of polishing the separation surface side of the bonded silicon single crystal film.

3. The method of fabricating an SOI wafer as claimed in claim 2, wherein, in the polishing step, polishing stock removal of the separation surface side of the bonded silicon single crystal film is based on the roughness (Rms) of the separation surface of the bonded silicon single crystal film, wherein less polishing stock removal is conducted when the roughness of the separation surface is lowered.

4. The method of fabricating an SOI wafer as claimed in claim 3, wherein the dose of the ion implantation, and the polishing stock removal, in the polishing step, of the separation surface side of the bonded silicon single crystal film are based on the thickness of the SOI layer to be obtained, wherein less polishing stock removal is conducted when the roughness of the separation surface is lowered.

5. The method of fabricating an SOI wafer as claimed in claim 1, wherein the insulating film is a silicon oxide film.

6. The method of fabricating an SOI wafer as claimed in claim 2, wherein the insulating film is a silicon oxide film.

7. The method of fabricating an SOI wafer as claimed in claim 3, wherein the insulating film is a silicon oxide film.

8. The method of fabricating an SOI wafer as claimed in claim 4, wherein the insulating film is a silicon oxide film.

9. The method of fabricating an SOI wafer as claimed in claim 1, wherein the planarization step further comprises polishing the separation surface of the bonded silicon single crystal, wherein the SOI layer has a layer thickness uniformity of 1.5 nm or less following polishing.

10. The method of fabricating an SOI wafer as claimed in claim 1, wherein the dose of the ion implantation is from $3\times10^{16}/cm^2$ to $5\times10^{16}/cm^2$.

11. The method of fabricating an SOI wafer as claimed in claim 1, wherein the roughness (Rms) of 4.5 nm or less for the separation surface of the bonded silicon single crystal film is obtained at the separation of the bonded silicon single crystal film from the second substrate.

* * * * *